(12) United States Patent
Hashimoto

(10) Patent No.: US 6,410,366 B1
(45) Date of Patent: Jun. 25, 2002

(54) SEMICONDUCTOR DEVICE AND MANUFACTURING METHOD THEREOF, CIRCUIT BOARD AND ELECTRONIC EQUIPMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/555,135

(22) PCT Filed: Sep. 3, 1999

(86) PCT No.: PCT/JP99/04786

§ 371 (c)(1),
(2), (4) Date: May 25, 2000

(87) PCT Pub. No.: WO00/19515

PCT Pub. Date: Apr. 6, 2000

(30) Foreign Application Priority Data

Sep. 30, 1998 (JP) .............................................. 10-292933

(51) Int. Cl.[7] .......................... H01L 21/44; H01L 21/48; H01L 21/50; H01L 23/48; H01L 23/52; H01L 29/40; H05K 1/00; H05K 1/18; H05K 7/02; H05K 7/06; H05K 7/08; H05K 7/10; H05K 7/12

(52) U.S. Cl. ........................ 438/125; 438/108; 257/778; 361/748; 361/760; 361/770

(58) Field of Search ................................. 438/108, 125; 257/778; 361/748, 760, 770

(56) References Cited

U.S. PATENT DOCUMENTS 5,659,952 A * 8/1997 Kovac et al. .................. 29/840
6,046,910 A * 4/2000 Ghaem et al. ............... 361/760

FOREIGN PATENT DOCUMENTS

| EP | 0 415 541 A1 | 3/1991 |
| JP | 09-260535 | 3/1997 |

* cited by examiner

Primary Examiner—Tuan H. Nguyen
Assistant Examiner—Nema Berezny
(74) Attorney, Agent, or Firm—Oliff & Berridge PLC

(57) ABSTRACT

A semiconductor device comprising: a semiconductor chip (10) which is subjected to face-down bonding, having a plurality of electrodes (12) aligned on a straight line (L); a substrate (20) on which is formed an interconnect pattern (22) having bonding portions (24) to which the electrodes (12) of the semiconductor chip (10) are connected and lands (26) electrically connected to the bonding portions (24); external electrodes (30) passing through the substrate (20) and connected to the lands (26); and a support formed from bumps (11, 21) provided between the semiconductor chip (10) and substrate (20), wherein the connected electrodes (12) and bonding portions (24) and the support formed by the bumps (11, 21) maintain the semiconductor chip (10) and substrate (20) substantially parallel.

44 Claims, 6 Drawing Sheets

SEMICONDUCTOR DEVICE AND MANUFACTURING METHOD THEREOF, CIRCUIT BOARD AND ELECTRONIC EQUIPMENT

TECHNICAL FIELD

The present invention relates to a semiconductor device and method of manufacture thereof, to a circuit board, and to an electronic instrument.

TECHNICAL ART

In recent years, with the increasing compactness of electronic instruments, semiconductor device packages adapted to high density mounting are in demand. In response to this, surface mounting packages such as BGA (Ball Grid Array) and CSP (Chip Scale/Size Package) have been developed. Such packages have been applied, for example, to the packaging of semiconductor chips such as DRAM or synchronous DRAM in which a plurality of electrodes is arranged in a row. More specifically, a semiconductor chip and the substrate on which an interconnect pattern is formed are disposed spaced apart, and leads forming a part of the interconnect pattern are bent and bonded to the semiconductor chip electrodes.

According to this construction, the bonding must be carried out for each single lead, and therefore when the spacing between electrodes is small, a precision bonding process is required, and this is difficult to support.

DISCLOSURE OF THE INVENTION

The present invention solves this problem, and has as its objective the provision of a compact semiconductor device which uses a semiconductor chip having electrodes disposed in a row and method of manufacture thereof, a circuit board, and an electronic instrument.

(1) A semiconductor device of the present invention comprises:

a semiconductor chip which is subjected to face-down bonding, having a plurality of electrodes aligned to be concentrated on a straight line;

a substrate, superposed on the semiconductor chip, on which is formed an interconnect pattern having bonding portions to which the electrodes of the semiconductor chip are connected and lands electrically connected to the bonding portions; and at least one support provided between the semiconductor chip and the substrate;

wherein using the connected electrodes and bonding portions and the support, the substrate superposed on the semiconductor chip is maintained substantially parallel to the semiconductor chip.

According to the present invention, the plurality of electrodes are aligned concentrated on a straight line, and the semiconductor chip which would not be stable with the electrodes and bonding portions alone, is maintained parallel to the substrate by the support. Therefore, the lateral sides of the semiconductor chip contacting the interconnect pattern formed on the substrate and making an electrical connection is prevented. Furthermore, bending of the substrate can be prevented.

Since the semiconductor chip is subjected to face-down bonding, the bonding is carried out within the area of the semiconductor chip. Therefore, the area of the substrate can be reduced to the minimum necessary. As a result, the semiconductor device can be made more compact.

(2) A semiconductor device of the present invention comprises:

a semiconductor chip which is subjected to face-down bonding, having a plurality of electrodes aligned to be concentrated in the vicinity of a straight line;

a substrate superposed on the semiconductor chip on which is formed an interconnect pattern having bonding portions to which the electrodes of the semiconductor chip are connected and lands electrically connected to the bonding portions; and at least one support provided between the semiconductor chip and the substrate;

wherein using the connected electrodes and bonding portions and the support, the substrate superposed on the semiconductor chip is maintained substantially parallel to the semiconductor chip.

According to the present invention, a plurality of electrodes are aligned concentrated in the vicinity of a straight line, and the semiconductor chip which would not be stable with the electrodes and bonding portions alone is maintained parallel to the substrate by the support. Therefore, the lateral sides of the semiconductor chip contacting the interconnect pattern formed on the substrate and making an electrical connection is prevented. Furthermore, bending of the substrate can be prevented.

Since the semiconductor chip is subjected to face-down bonding, the bonding is carried out within the area of the semiconductor chip. Therefore, the area of the substrate can be reduced to the minimum necessary. As a result, the semiconductor device can be made more compact.

(3) The semiconductor device may further comprise external electrodes connected to the lands.

Since the semiconductor chip and substrate and are maintained parallel, stress applied from the external electrodes is transmitted in a balanced way, and concentration of stress can be prevented.

(4) In this semiconductor device, the support may be provided in a position distanced from the straight line on which the electrodes are concentrated.

By positioning the support in this way, a polygon being at least a triangle is formed by joining the bonded electrodes and bonding portions and the support, and the semiconductor chip and substrate can be maintained parallel.

(5) In this semiconductor device, with the semiconductor chip conceived as divided into two regions by a notional center line, the support may be provided in the region on the opposite side from the region in which the external electrodes are provided.

(6) In this semiconductor device, the electrodes may be provided in a center portion of the semiconductor chip, and the support may be formed in a peripheral portion of the semiconductor chip.

(7) In this semiconductor device, a plurality of the supports may be provided, and the distance between adjacent of the supports may be formed to be larger than the distance between adjacent of the electrodes.

(8) In this semiconductor device, the support may take approximately the same flat shape as the electrodes.

Since the support can be provided close to a point in form, it may be squashed down to adjust the height.

(9) In this semiconductor device, the support may be formed in a position distanced from the lands.

Since the support is provided in a position distanced from the external electrodes, even if the contact portion of the support on the substrate is bent, the uniformity of height (coplanarity) of the external electrodes can be assured.

(10) In this semiconductor device, the support may be formed of an electrically insulating material.

By this means, electrical connection between the semiconductor chip and the interconnect pattern of the substrate can be prevented.

(11) In this semiconductor device, the support may be formed by bonding first bumps formed on the semiconductor chip of the same material as the electrodes and distanced from the electrodes and second bumps formed on the substrate of the same material as the interconnect pattern and distanced from the interconnect pattern.

The first bumps can be formed at the same time as the electrodes, and the second bumps can be formed at the same time as the interconnect pattern, thus avoiding an increase in the number of manufacturing processes.

(12) In this semiconductor device, the electrodes of the semiconductor chip may be connected to the bonding portions through an anisotropic conductive material formed of conductive particles dispersed within an adhesive.

Since the bonding portions and electrodes are electrically connected by the anisotropic conductive material, a connection of excellent reliability is obtained.

(13) A method of manufacturing a semiconductor device of the present invention comprises:
  a step of providing a semiconductor chip having a plurality of electrodes aligned to be concentrated on a straight line;
  a step of providing a substrate on which is formed an interconnect pattern having bonding portions formed in positions corresponding to the electrodes of the semiconductor chip, and lands electrically connected to the bonding portions;
  a step of subjecting the semiconductor chip to face-down bonding to connect the electrodes to the bonding portions; and
  a step of providing at least one support between the semiconductor chip and the substrate, of approximately the same height as the total thickness of the electrodes and the bonding portions.

According to the present invention, a plurality of electrodes are aligned concentrated on a straight line, and the semiconductor chip which would not be stable with the electrodes alone, is maintained parallel to the substrate by the support. Therefore, bonding can be carried out appropriately so that the electrodes and bonding portions are not bent. The lateral sides of the semiconductor chip contacting the interconnect pattern formed on the substrate and making an electrical connection is prevented. Furthermore, bending of the substrate can be prevented.

Since the semiconductor chip is subjected to face-down bonding, the bonding is carried out within the area of the semiconductor chip. Therefore, the area of the substrate can be reduced to the minimum necessary. As a result, the semiconductor device can be made more compact.

(14) A method of manufacturing a semiconductor device of the present invention comprises:
  a step of providing a semiconductor chip having a plurality of electrodes aligned to be concentrated in the vicinity of a straight line;
  a step of providing a substrate on which is formed an interconnect pattern having bonding portions formed in positions corresponding to the electrodes of the semiconductor chip, and lands electrically connected to the bonding portions;
  a step of subjecting the semiconductor chip to face-down bonding to connect the electrodes to the bonding portions; and
  a step of providing at least one support between the semiconductor chip and the substrate, of approximately the same height as the total thickness of the electrodes and the bonding portions.

According to the present invention, a plurality of electrodes are aligned concentrated in the vicinity of a straight line, and the semiconductor chip which would not be stable with the electrodes alone, is maintained parallel to the substrate by the support. Therefore, bonding can be carried out appropriately so that the electrodes and bonding portions are not bent. The lateral sides of the semiconductor chip contacting the interconnect pattern formed on the substrate and making an electrical connection is prevented. Furthermore, bending of the substrate can be prevented.

Since the semiconductor chip is subjected to face-down bonding, the bonding is carried out within the area of the semiconductor chip. Therefore, the area of the substrate can be reduced to the minimum necessary. As a result, the semiconductor device can be made more compact.

(15) In the step of providing a support in this method, the support may be provided beforehand on one of the semiconductor chip and the substrate, and the other of the semiconductor chip and the substrate may be contacted with the support.

(16) In the step of providing a support in this method, the support may be formed by bonding first bumps formed on the semiconductor chip of the same material as the electrodes and distanced from the electrodes and second bumps formed on the substrate of the same material as the interconnect pattern and distanced from the interconnect pattern.

The first bumps can be formed at the same time as the electrodes, and the second bumps can be formed at the same time as the interconnect pattern, thus avoiding an increase in the number of manufacturing processes.

(17) In this method, the support may be formed of an electrically insulating material.

By this means, electrical connection between the semiconductor chip and the interconnect pattern of the substrate can be prevented.

(18) In this method, the semiconductor chip may be subjected to face-down bonding to connect the electrodes with the bonding portions through an anisotropic conductive material formed of conductive particles dispersed within an adhesive.

Since the bonding portions and electrodes are electrically connected by the anisotropic conductive material, a semiconductor device can be manufactured by a method of excellent reliability and productivity.

(19) This method of manufacturing a semiconductor device may further comprise a step of forming external electrodes on the lands.

By means of the semiconductor device thus obtained, the semiconductor chip and substrate are maintained parallel, stress applied from the external electrodes is transmitted in a balanced way, and concentration of stress can be prevented.

(20) To a circuit board according to the present invention, the above-described semiconductor device is mounted.

(21) An electronic instrument according to the present invention has the above-described circuit board.

BEST MODE FOR CARRYING OUT THE INVENTION

The present invention is now described in terms of a number of preferred embodiments, with reference to the drawings.

First Embodiment

Figure 1A:
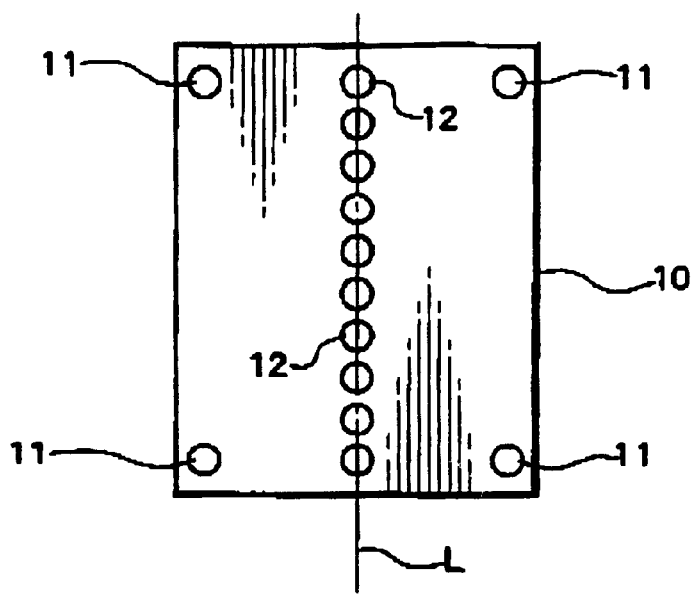
FIGS. 1A to 1C illustrate a first embodiment of a semiconductor device to which the present invention is applied.
Figure 1B:
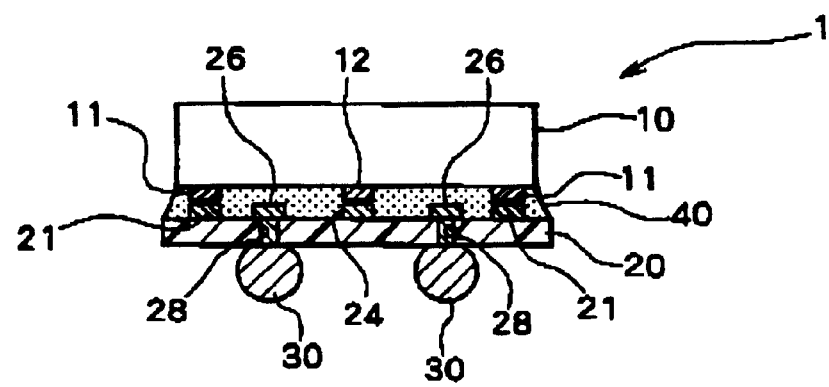
Figure 1C:
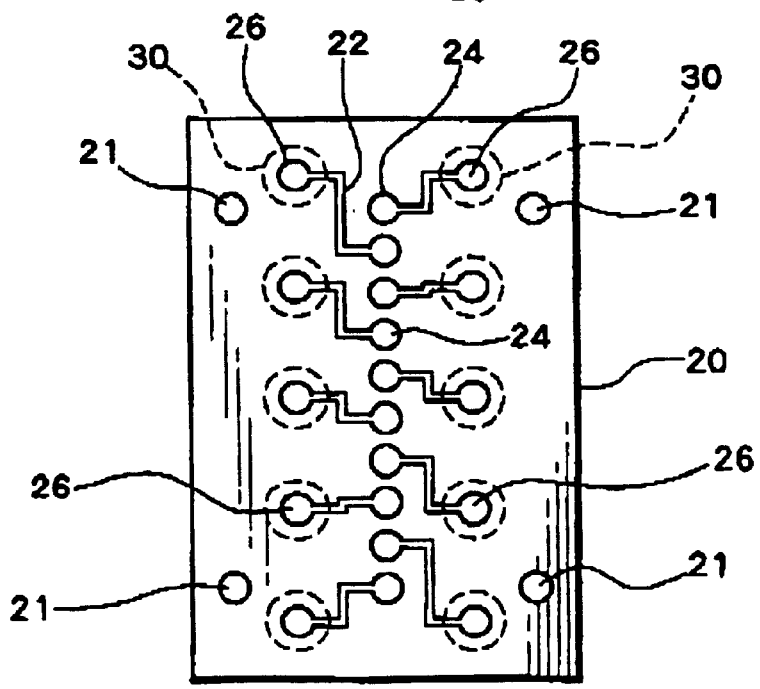

FIGS. 1A to 1C illustrate a first embodiment of a semiconductor device to which the present invention is applied. It should be noted that FIG. 1A shows the active surface of the semiconductor chip forming a part of the semiconductor device, FIG. 1B is a sectional view of the semiconductor device, and FIG. 1C shows the surface of the substrate, forming a part of the semiconductor device, on which the interconnect pattern is formed. A semiconductor device 1 comprises a semiconductor chip 10 and substrate 20.

The semiconductor chip 10 is for example a DRAM or synchronous DRAM, and has a plurality of electrodes 12. The electrodes 12 are disposed concentrated on and around a straight line L. For example, the electrodes 12 can be arranged in a row on the straight line L. The straight line L extends parallel to the longer edges and in the center of the rectangular semiconductor chip 10, but may equally extend parallel to the shorter edges. The electrodes 12 are commonly of gold formed by plating or wire bonding and tearing out, but may equally be of nickel, solder, or the like.

On the semiconductor chip 10 is provided one or a plurality of bumps 11. The bumps 11 are provided in positions removed from the straight line L. For example, the bumps 11 may be provided in at least one of the four corners of the semiconductor chip 10. Alternatively, one or a plurality of bumps 11 may be provided in central portions (portions excluding the corners) of the longer edges parallel to the straight line L of the semiconductor chip 10. The bumps 11 are preferably formed of an electrically insulating material. The bumps 11 are resilient and of relatively small form such as to be able to be squashed down, and are preferably for example of approximately the same flat shape as the electrodes 12. When the bumps 11 are formed of the same material as the electrodes 12 in the same process, it is preferable to provide an electrical insulating means by covering with an insulating film, for example. In this case also, it is preferable for the bumps 11 to be of sufficiently small form to be seen as points. The bumps 11 can be formed of approximately the same height as the electrodes 12, but are not limited thereto. The bumps 11 form a support in combination with bumps 21 formed on the substrate 20. The bumps 11 may function as electrodes 12 (may form electrical contacts), and may be connected to other interconnect patterns. This is also true similarly of the embodiments described hereafter.

The substrate 20 may be formed of either an organic or an inorganic material, or may equally be a composite structure thereof. As a substrate 20 formed of an organic material may be cited for example a flexible substrate formed of a polyimide resin. As a substrate 20 formed of an inorganic material may be cited for example a ceramic substrate or glass substrate. As a composite structure of organic and inorganic material may be cited for example a glass epoxy substrate.

On the substrate 20 is formed an interconnect pattern 22. The interconnect pattern 22 is formed on one surface of the substrate 20. It should be noted that in addition to the interconnect pattern 22 on one surface of the substrate 20, an interconnect pattern may also be formed on the other surface.

The interconnect pattern 22 can be formed by applying a conductive film of copper or the like by sputtering or the like to the substrate 20, and etching this. In this case, the interconnect pattern 22 is formed directly on the substrate 20, to form a two-layer substrate with no intervening adhesive. Alternatively, the additive method may be applied in which the pattern is formed by plating. Alternatively, a three-layer substrate may be used in which there is an intervening adhesive between the substrate 20 and the interconnect pattern 22. Alternatively may be used a substrate built-up multilayer construction in which insulating resin and an interconnect pattern are laminated on a substrate, or a multilayer substrate having a plurality of substrates laminated.

The interconnect pattern 22 includes a plurality of bonding portions 24 and a plurality of lands 26. The bonding portions 24 are aligned to correspond to the electrodes 12 of the semiconductor chip 10, and are disposed in a row on the substrate 20. The center spacing of adjacent bonding portions 24 is equal to the center spacing of adjacent electrodes 12 of the semiconductor chip 10. The lands 26 are provided on the substrate 20 on the outside of the bonding portions 24 (toward the edges). It should be noted that the lands 26 may be provided in a single row or multiple rows parallel to the row of bonding portions 24, or may surround the bonding portions 24.

In this embodiment, the electrodes 12 are provided in the center of the width of the semiconductor chip 10, and therefore the bonding portions 24 are also disposed in the center of the width of the substrate 20. As a result, the distance between the bonding portions 24 and the lands 26 can be made short, and since the interconnects are short the electrical characteristics are improved.

One of the bonding portions 24 is electrically connected to at least one of the lands 26. The bonding portions 24 and lands 26 are formed with greater area than the portion for the interconnect. It should be noted that bumps may be formed on the bonding portions 24. The bonding portions 24 and lands 26 are disposed within the mounting area of the semiconductor chip 10 on the substrate 20, and may not be formed outside that area but may equally be formed outside that area.

In the substrate 20 are formed through holes 28. Then on the through holes 28 are positioned lands 26. That is to say, the lands 26 can be connected through the through holes 28 to the surface opposite to the surface on which the interconnect pattern 22 is formed. In this way, on the surface of the substrate 20 opposite to the surface on which the interconnect pattern 22 is formed, a plurality of external electrodes 30 can be formed electrically connected to the interconnect pattern 22. That is to say, the external electrodes 30 are provided to pass through the substrate 20, and on the lands 26.

On the substrate 20, one or a plurality of bumps 21 are provided. The bumps 21 are provided in number and positions corresponding to the bumps 11 provided on the semiconductor chip 10. The bumps 21 may be formed to be of approximately the same size and form as the bumps 11. The bumps 21 are provided on the substrate 20 on the outside of the bonding portions 24 and lands 26 (toward the edges). Therefore, the bumps 11 are also provided on the outside of (toward the edges from) the area of formation of the bonding portions 24 and lands 26. The bumps 11 and 21 are provided on the outside of (toward the edges from) the external electrodes 30 provided on the lands 26.

The bumps 21 are preferably formed of an electrically insulating material. Bumps 21 are preferably resilient, and of relatively small form such as to be able to be squashed down. When the bumps 21 are formed of the same material as the interconnect pattern 22 and in the same process, it is preferable to provide an electrical insulating means by covering with an insulating film, for example. In this case also, it is preferable for the bumps 21 to be of sufficiently small form to be seen as points. By this means, even if the bumps 21 cannot be squashed down, by denting the substrate 20 the height can be adjusted. The bumps 21 may be formed of approximately the same height as the bonding portions 24 and lands 26, but this is not limiting on the invention.

The bumps 21 form a support in combination with the bumps 11 formed on the semiconductor chip 10. If the electrodes 12 of the semiconductor chip 10 are arranged in a row, there is no stability when mounting on the substrate 20. Here, in addition to the connected electrodes 12 and bonding portions 24, the bumps 11 and 21 also form a support, and the semiconductor chip 10 and substrate 20 are maintained parallel. The total height of the bumps 11 and 21 is preferably equal to the total height of the electrodes 12 and bonding portions 24. Alternatively, even if the total height of the bumps 11 and 21 is more than the total height of the electrodes 12 and bonding portions 24, by squashing down the bumps 11 and 21 the height can be adjusted. Alternatively, the height may be adjusted without squashing down the bumps 11 and 21 themselves, by forming slight dents in the substrate 20.

Using the height relationship and positional relationship of the previously described electrodes 12 and bonding portions 24, the active surface of the semiconductor chip 10 and the surface of the substrate 20 can be stably assured to be parallel, and the bonding thereof and the filling with resin therebetween can be done in a balanced way, so that the mechanical connection reliability is amply assured.

The semiconductor chip 10 is subjected to face-down bonding to the substrate 20 with an anisotropic conductive material 40 interposed. The anisotropic conductive material 40 comprises an adhesive (binder) in which conductive particles (conductive filler) are dispersed, and may also include a dispersant. The anisotropic conductive material 40 may be formed into a sheet and then adhered to the substrate 20, or may be disposed on the substrate 20 while still in liquid form. It should be noted that as the adhesive of the anisotropic conductive material 40 is commonly used a thermosetting adhesive. The anisotropic conductive material 40 is provided at least on the bonding portions 24. Alternatively, if the anisotropic conductive material 40 is provided to cover the whole substrate 20, the process can be carried out simple. It should be noted that if the anisotropic conductive material 40 is provided excepting the outer periphery of the substrate 20, the anisotropic conductive material 40 is prevented from adhering to the outer peripheral surface of the substrate 20, and this convenient with respect to the subsequent handling of the substrate 20.

The anisotropic conductive material 40 is squashed between the electrodes 12 and bonding portions 24, and an electrical connection is provided by the conductive particles between the two. If the semiconductor chip 10 is subjected to face-down bonding, then in place of the anisotropic conductive material 40, at least any one of light, heat, pressure, and vibration may be used to bond the electrodes 12 and the bonding portions 24. In this case, the reliability of the bonding between the metals is high. In that case, an underfill resin is commonly provided to fill between the semiconductor chip 10 and the substrate 20. By the shrinking force of curing of the underfill resin alone, the electrodes 12 and bonding portions 24 may be mechanically maintained in contact.

The external electrodes 30 are provided on lands 26 of the interconnect pattern 22. In more detail, the external electrodes 30 are provided on the surface of the substrate 20 opposite to the surface on which the interconnect pattern 22 is formed, and are electrically connected to the lands 26 through the through holes 28. The electrical connection of the external electrodes 30 and lands 26 is commonly formed by mounting solder balls together with flux on through holes 28 on the surface of the substrate 20 opposite to the surface of the semiconductor chip mounting, and carrying out reflow, but may equally be achieved by a conductive member of gold, copper, or the like plated on the inner surface of the through holes 28. Alternatively, when solder balls are used as the external electrodes 30, the through holes 28 may be filled with the solder which is the material of the solder balls, and a conductive member formed integrally with the solder balls within the through holes 28.

Further, external electrode lands connected to the interconnect pattern 22 by via holes or through holes may be formed opposite to the surface of the semiconductor chip mounting, and external electrodes may be formed thereon. The external electrodes may be formed of a metal other than the solder described above or of conductive resin or the like.

This embodiment is constructed as described above, and an example of the method of manufacture thereof is now described. First, the substrate 20 is prepared, with the interconnect pattern 22 having a plurality of bonding portions 24 and a plurality of lands 26 connected to the bonding portions 24. Then on the surface of the substrate 20 on which the interconnect pattern 22 is formed, the anisotropic conductive material 40 is provided. In more detail, at least on the bonding portions 24, the anisotropic conductive material 40 is provided.

Then a plurality of semiconductor chips 10 each having a plurality of electrodes 12 is prepared. The electrodes 12 are positioned on the bonding portions 24 in the anisotropic conductive material 40, and the semiconductor chip 10 is mounted on the substrate 20.

Next, pressure is applied to at least one of the semiconductor chip 10 and substrate 20, and the bonding portions 24 and electrodes 12 are electrically connected through the conductive particles of the anisotropic conductive material 40.

Then from the side opposite to the surface of formation of the interconnect pattern 22 on the substrate 20, with the through holes 28 interposed, external electrodes 30 are formed on the lands 26.

By means of the above process, the semiconductor device 1 is obtained. According to this embodiment, since the bonding portions 24 and electrodes 12 are electrically connected by the anisotropic conductive material 40, the semiconductor device 1 can be manufactured by a method of excellent reliability and productivity. Moreover, according to this embodiment, since the face-down bonding of the semiconductor chip 210 can be carried out stably by means of the support provided by the bumps 11 and 21, the process yield is improved.

Figure 2A:
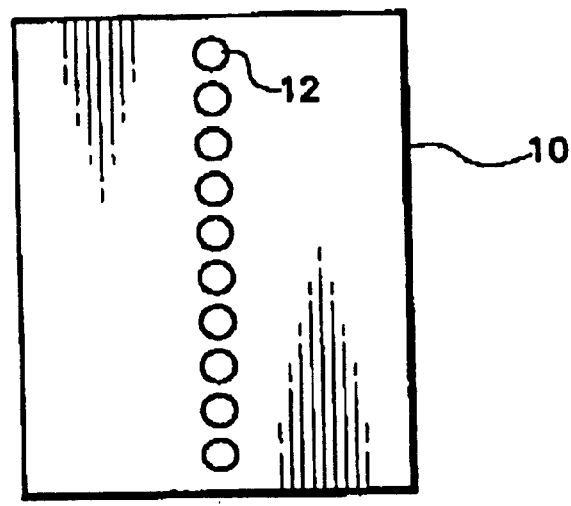
FIGS. 2A to 2C illustrate a modification of the first embodiment of a semiconductor device to which the present invention is applied.
Figure 2B:
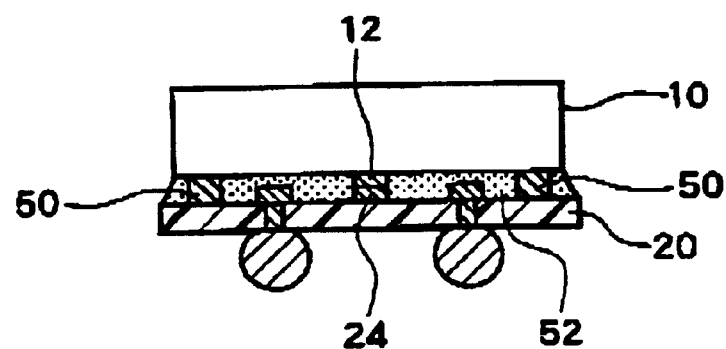
Figure 2C:
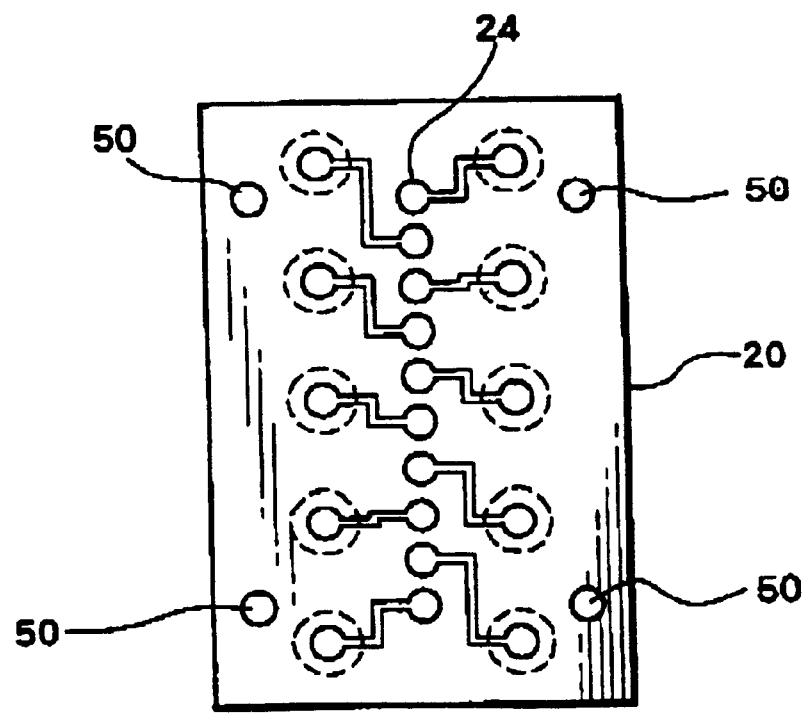

In this embodiment, the bumps 11 and 21 are provided on the semiconductor chip 10 and substrate 20 respectively, but a support may be provided on one of these only. For example, as shown in FIGS. 2A to 2C, a support 50 may be provided on the substrate 20 only, with bumps not provided on the semiconductor chip 10. The support 50 can be formed by the method originally used in the substrate formation process, for example, by using an electrically insulating material such as solder resist. The support 50 may be formed on the semiconductor chip 10 by printing, transfer, inkjet, or other methods.

It should be noted that in the example give above connection is made by an anisotropic conductive material, but the electrodes 12 and bonding portions 24 may be bonded by at least any one of light, heat, pressure and vibration, or may be connected by the conventional metal bonding or pressure-bonded by an insulating adhesive. The height of the support 50 is approximately the same as the total height of the electrodes 12 and bonding portions 24. Between the semiconductor chip 10 and substrate 20 is filled with an underfill resin 52. In other respects the construction and method of manufacture is the same as in the above described embodiment.

Further, in this embodiment, a semiconductor chip in which the electrodes are exactly arrayed on a straight line has been described, but the present invention is not limited thereto. For example, even if of the plurality of electrodes, one group (plurality) of electrodes may be disposed in a row exactly on a straight line, and at least one electrode not in this group of electrodes may be arranged in a position not on the straight line, if that electrode has the distance away from the straight line and the distance is relatively small compared with the length of a side of the semiconductor chip, so that this can be perceived as substantially a row, then the present invention can be applied. Alternatively, if the semiconductor chip has the electrodes aligned in a plurality of rows, then if the spacing between adjacent rows of electrodes is relatively small compared with the length of a side of the semiconductor chip, so that this can be perceived as substantially a row, then the present invention can be applied. In this case also, by applying the countermeasures of the present embodiment, stable face-down bonding can be carried out. The same is true of the other embodiments described below.

Second Embodiment

Figure 3A:
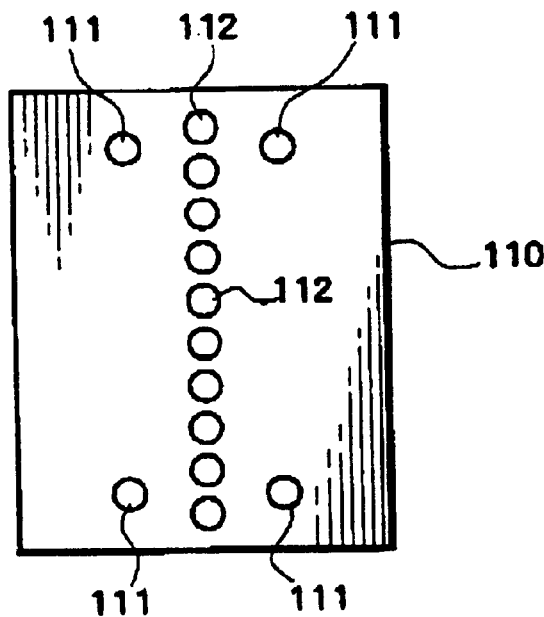
FIGS. 3A to 3C illustrate a second embodiment of a semiconductor device to which the present invention is applied.
Figure 3B:
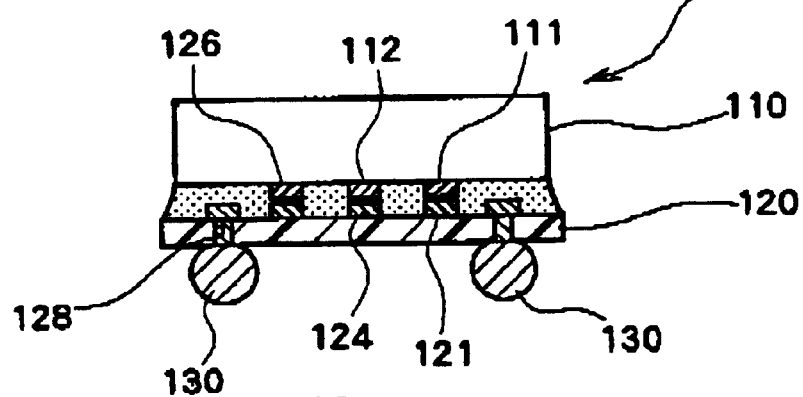
Figure 3C:
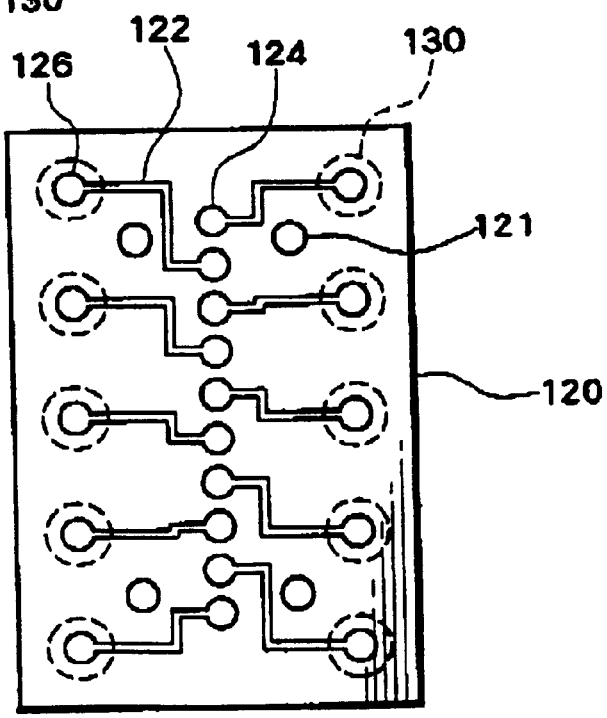

FIGS. 3A to 3C illustrate a second embodiment of a semiconductor device to which the present invention is applied. It should be noted that FIG. 3A shows the active surface of the semiconductor chip forming a part of the semiconductor device. FIG. 3B is a sectional view of the semiconductor device, and FIG. 3C shows the surface of the substrate forming a part of the semiconductor device on which the interconnect pattern is formed. A semiconductor device 2 comprises a semiconductor chip 110 and a substrate 120.

The semiconductor chip 110 has a plurality of electrodes 112 and one or a plurality of bumps 111. Except for the position of the bumps 111, the semiconductor chip 110 has the same construction as the semiconductor chip 10 in the first embodiment. That is to say, the bumps 111 are positioned closer to the central portion of the semiconductor chip 110 than the bumps 11 shown in FIG. 1A.

The substrate 120 is provided with an interconnect pattern 122, a plurality of bonding portions 124, and a plurality of lands 126, and external electrodes 130 are provided on the lands 126 with through holes 128 interposed. The lands 126 are provided toward the edges of the substrate 120, and the interconnect pattern 122 is formed in a corresponding form. The external electrodes 130 are also provided in the same position as the lands 126. Then bumps 121 are provided closer to the central portion of the substrate 120 than the lands 126 and external electrodes 130. Otherwise the construction and method of manufacture are the same as the first embodiment of the semiconductor device 1. A support other than the bumps 111 and 121 may be formed on the semiconductor chip 110 or substrate 120.

In this way, the present invention can also be applied to a construction in which the bumps 121 are provided closer to the central portion of the substrate 120 than the lands 126 and external electrodes 130.

Third Embodiment

Figure 4A:
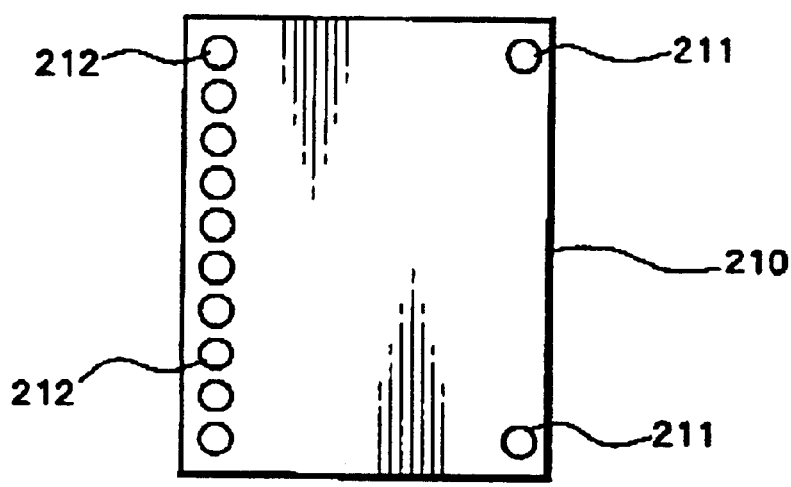
FIGS. 4A to 4C illustrate a third embodiment of a semiconductor device to which the present invention is applied.
Figure 4B:
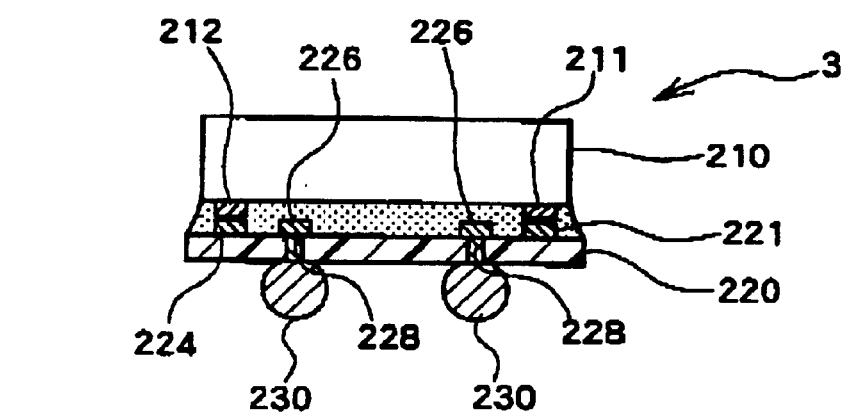
Figure 4C:
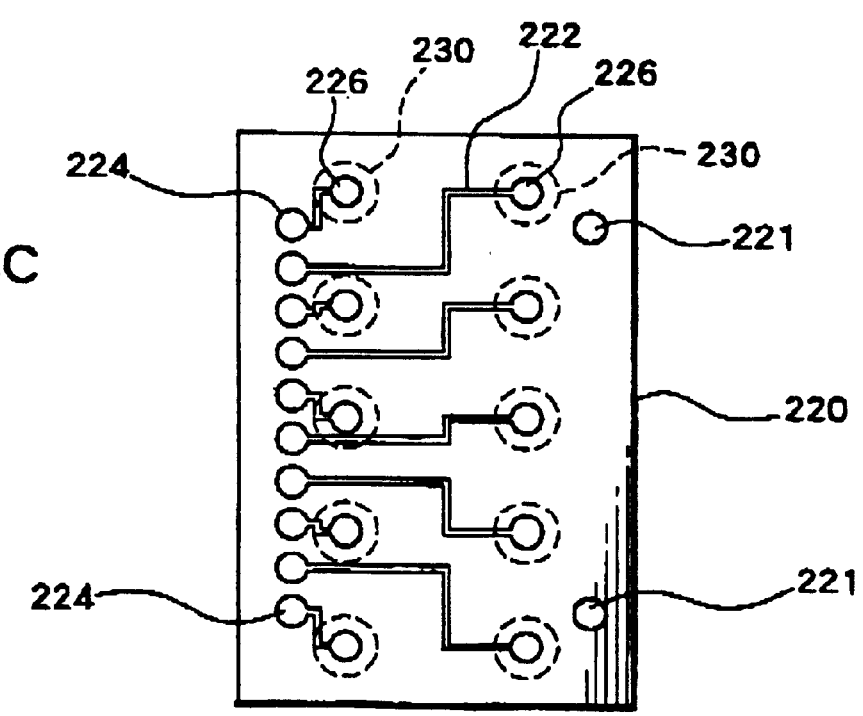

FIGS. 4A to 4C illustrate a third embodiment of a semiconductor device to which the present invention is applied. It should be noted that FIG. 4A shows the active surface of the semiconductor chip forming a part of the semiconductor device. FIG. 4B is a sectional view of the semiconductor device, and FIG. 4C shows the surface of the substrate forming a part of the semiconductor device on which the interconnect pattern is formed. A semiconductor device 3 comprises a semiconductor chip 210 and a substrate 220.

The semiconductor chip 210 is provided with a plurality of electrodes 212 and one or a plurality of bumps 211. The electrodes 212 are arranged in a row on an edge portion defining a side of the semiconductor chip 210. The bumps 211 are provided on another edge portion defining the other side parallel to that side. The bumps 211 are provided at at least one of the two corners of the edge portion. Alternatively, one or a plurality of bumps 211 may be provided in a center of the edge portion.

The substrate 220 is provided with an interconnect pattern 222, a plurality of bonding portions 224, and a plurality of lands 226, and external electrodes 230 are provided on the lands 226 with through holes 228 interposed. The bonding portions 224 are aligned in a row on an edge portion defining a side of the substrate 220, corresponding to the electrodes 212. Bumps 221 are provided on another edge portion defining the other side parallel to that side. The bumps 221 are provided at at least one of the two corners of the edge portion. Alternatively, one or a plurality of bumps 221 may be provided in a center of the edge portion. Then the lands 226 are formed toward the central portion of the substrate 220 from the bonding portions 224 and bumps 221. Alternatively, the lands 226 may be formed on an edge portion defining a side opposite to the side of the bonding portions 224, and one or a plurality of bumps 221 may be provided toward the center from the lands. Otherwise the construction and method of manufacture are the same as the semiconductor device 1 of the first embodiment. A support other than the bumps 211 and 221 may be formed on the semiconductor chip 210 or substrate 220.

According to this embodiment, when the semiconductor chip 210 having the electrodes 212 provided in a row on an edge portion close to one side is mounted on the substrate 220, the semiconductor chip 210 and substrate 220 are maintained parallel by the support formed by the bumps 211 and 221 in addition to the connected electrodes 212 and bonding portions 224. Therefore, face-down bonding of the semiconductor chip 210 can be carried out with stability, and as a result the process yield is improved.

In this embodiment, an application to a CSP type semiconductor device was described, but the present invention is characterized by the mounting configuration of the semiconductor chip and substrate, and therefore can be applied to a face-down type semiconductor device having at least one semiconductor chip, or a module construction thereof. As examples of a face-down type semiconductor device may be cited COF (Chip On Flex/Film) construction, COB (Chip On Board) construction, and so forth. Application to a CSP type semiconductor device having a plurality of semiconductor chips mounted is possible.

In this embodiment, a semiconductor device having external terminals has been described, but a part of the substrate may be extended, and external connections made thereby. It is also possible for a part of the substrate to form the leads of a connector, for a connector to be mounted on the substrate, or for the substrate interconnect pattern itself to be connected to another electronic instrument.

Furthermore, when actively not forming external terminals and using motherboard mounting, using the solder cream painted on the motherboard, external terminals may be effectively formed by the surface tension during the fusion thereof. Such a semiconductor device is a so-called land grid array type of semiconductor device.

Figure 5:
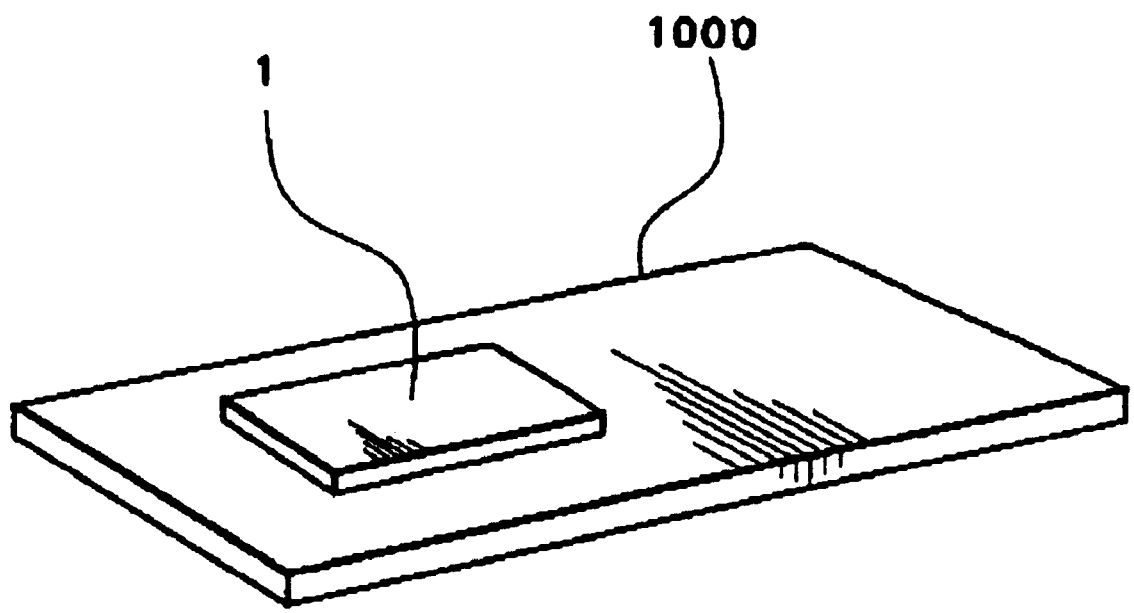
FIG. 5 shows a circuit board having mounted this embodiment of the semiconductor device.

In FIG. 5 is shown a circuit board 1000 on which is mounted the above described first embodiment of a semiconductor device 1. For the circuit board 1000 is generally used an organic substrate such as a glass epoxy substrate or the like. On the circuit board 1000, an interconnect pattern of for example copper is formed to constitute a desired circuit. Then by mechanical connection of the interconnect pattern and the external electrodes 30 of the semiconductor device 1 (see FIG. 1B), electrical connection is achieved.

It should be noted that the semiconductor device 1 has a mounting area which can be made as small as the area for mounting a bare chip, and therefore when this circuit board 1000 is used in an electronic instrument, the electronic instrument itself can be made more compact. Within the same area, a larger mounting space can be obtained, and therefore higher functionality is also possible.

Figure 6:
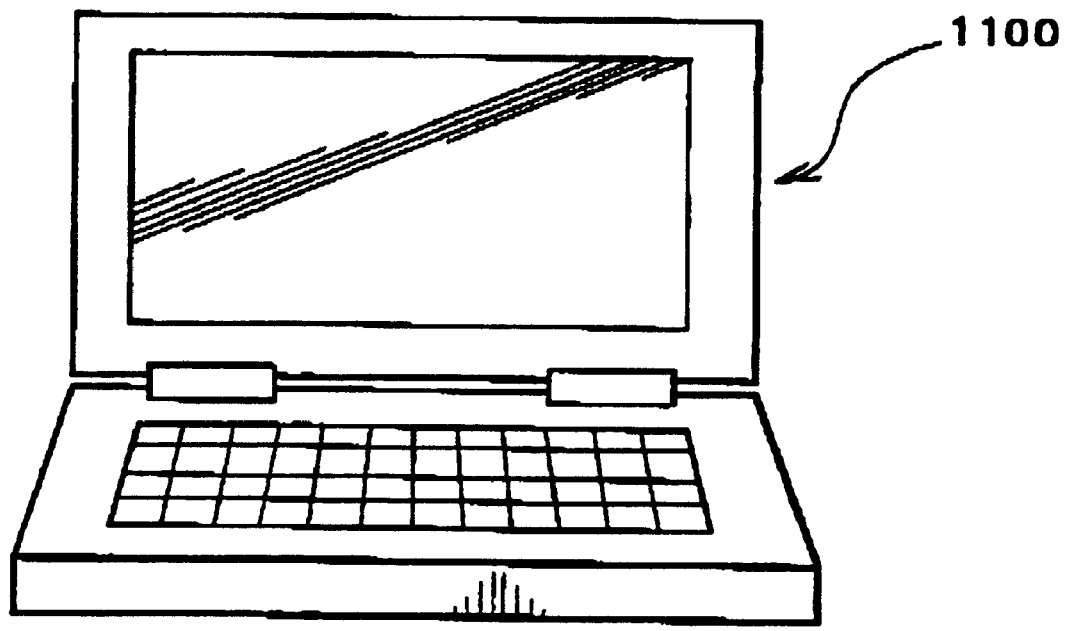
FIG. 6 shows an electronic instrument having a circuit board on which is mounted this embodiment of the semiconductor device.

Then as an electronic instrument equipped with this circuit board 1000, FIG. 6 shows a notebook personal computer 1100.

It should be noted that the above embodiments are examples of the present invention applied to a semiconductor device, but the present invention can be applied to various surface-mounted electronic components, whether active components or passive components, as long as they require a number of external electrodes in the same way as a semiconductor device. As electronic components, for example, may be cited resistors, capacitors, coils, oscillators, filters, temperature sensors, thermistors, varistors, variable resistors, and fuses.

Furthermore, in all of the above described embodiments, a plurality of semiconductor chips may be mounted. That is to say, semiconductor chips mounted with the above described mounting method and another mounting method, for example the face-down type mounting method of a semiconductor chip having bonding portions on the edge, or a semiconductor chip mounted by the wire bonding method may be combined. Further again, an electronic component other than the above described type of semiconductor chip may be combined with a semiconductor chip, in a so-called module type of semiconductor device construction.

What is claimed is:

1. A semiconductor device comprising:
a semiconductor chip which is subjected to face-down bonding, having a plurality of electrodes aligned to be concentrated on a straight line;
a substrate, superposed on the semiconductor chip, on which is formed an interconnect pattern having bonding portions to which the electrodes of the semiconductor chip are connected and lands electrically connected to the bonding portions, the lands for outer electrical connection; and
at lease one support provided between the semiconductor chip and the substrate;
wherein using the connected electrodes and bonding portions and the support, the substrate superposed on the semiconductor chip is maintained substantially parallel to the semiconductor chip.

2. A semiconductor device comprising:
a semiconductor chip which is subjected to face-down bonding, having a plurality of electrodes aligned to be concentrated in the vicinity of a straight line;
a substrate superposed on the semiconductor chip on which is formed an interconnect pattern having bonding portions to which the electrodes of the semiconductor chip are connected and lands electrically connected to the bonding portions, the lands for outer electrical connection; and
at least one support provided between the semiconductor chip and the substrate;
wherein using the connected electrodes and bonding portions and the support, the substrate superposed on the semiconductor chip is maintained substantially parallel to the semiconductor chip.

3. The semiconductor device as defined in claim 1, further comprising external electrodes connected to the lands.

4. The semiconductor device as defined in claim 2, further comprising external electrodes connected to the lands.

5. The semiconductor device as defined in claim 1, wherein the support is provided in a position distanced from the straight line on which the electrodes are concentrated.

6. The semiconductor device as defined in claim 2, wherein the support is provided in a position distanced from the straight line on which the electrodes are concentrated.

7. The semiconductor device as defined in claim 3,
wherein with the semiconductor chip conceived as divided into two regions by a notional center line, the support is provided in the region on the opposite side from the region in which the external electrodes are provided.

8. The semiconductor device as defined in claim 4,
wherein with the semiconductor chip conceived as divided into two regions by a notional center line, the support is provided in the region on the opposite side from the region in which the external electrodes are provided.

9. The semiconductor device as defined in claim 5,
wherein the electrodes are provided in a center portion of the semiconductor chip; and
wherein the support is formed in a peripheral portion of the semiconductor chip.

10. The semiconductor device as defined in claim 6,
wherein the electrodes are provided in a center portion of the semiconductor chip; and
wherein the support is formed in a peripheral portion of the semiconductor chip.

11. The semiconductor device as defined in claim 1,
wherein a plurality of the supports are provided; and
wherein the distance between adjacent of the supports is formed to be larger than the distance between adjacent of the electrodes.

12. The semiconductor device as defined in claim 2,
wherein a plurality of the supports are provided; and
wherein the distance between adjacent of the supports is formed to be larger than the distance between adjacent of the electrodes.

13. The semiconductor device as defined in claim 1, wherein the support takes approximately the same flat shape as the electrodes.

14. The semiconductor device as defined in claim 2, wherein the support takes approximately the same flat shape as the electrodes.

15. The semiconductor device as defined in claim 1, wherein the support is formed in a position distanced from the lands.

16. The semiconductor device as defined in claim 2, wherein the support is formed in a position distanced from the lands.

17. The semiconductor device as defined in claim 1, wherein the support is formed of an electrically insulating material.

18. The semiconductor device as defined in claim 2, wherein the support is formed of an electrically insulating material.

19. The semiconductor device as defined in claim 1, wherein the support is formed by bonding first bumps formed on the semiconductor chip of the same material as the electrodes and distanced from the electrodes and second bumps formed on the substrate of the same material as the interconnect pattern and distanced from the interconnect pattern.

20. The semiconductor device as defined in claim 2, wherein the support is formed by bonding first bumps formed on the semiconductor chip of the same material as the electrodes and distanced from the electrodes and second bumps formed on the substrate of the same material as the interconnect pattern and distanced from the interconnect pattern.

21. The semiconductor device as defined in claim 1, wherein the electrodes of the semiconductor chip are connected to the bonding portions through an anisotropic conductive material formed of conductive particles dispersed within an adhesive.

22. The semiconductor device as defined in claim 2, wherein the electrodes of the semiconductor chip are connected to the bonding portions through an anisotropic conductive material formed of conductive particles dispersed within an adhesive.

23. A method of manufacturing a semiconductor device, comprising:
   a step of providing a semiconductor chip having a plurality of electrodes aligned to be concentrated on a straight line;
   a step of providing a substrate on which is formed an interconnect pattern having bonding portions formed in positions corresponding to the electrodes of the semiconductor chip, and lands electrically connected to the bonding portions, the lands for outer electrical connection;
   a step of subjecting the semiconductor chip to face-down bonding to connect the electrodes to the bonding portions; and
   a step of providing at least one support between the semiconductor chip and the substrate, of approximately the same height as the total thickness of the electrodes and the bonding portions.

24. A method of manufacturing a semiconductor device, comprising:
   a step of providing semiconductor chip having a plurality of electrodes aligned to be concentrated in the vicinity of a straight line;
   a step of providing a substrate on which is formed an interconnect pattern having bonding portions formed in positions corresponding to the electrodes of the semiconductor chip, and lands electrically connected to the bonding portions, the lands for outer electrical connection;
   a step of subjecting the semiconductor chip to face-down bonding to connect the electrodes to the bonding portions; and
   a step of providing at least one support between the semiconductor chip and the substrate, of approximately the same height as the total thickness of the electrodes and the bonding portions.

25. The method of manufacturing a semiconductor device as defined in claim 23, wherein in the step of providing the support, the support is provided beforehand on one of the semiconductor chip and the substrate, and the other of the semiconductor chip and the substrate is contacted with the support.

26. The method of manufacturing a semiconductor device as defined in claim 24, wherein in the step of providing the support, the support is provided beforehand on one of the semiconductor chip and the substrate, and the other of the semiconductor chip and the substrate is contacted with the support.

27. The method of manufacturing a semiconductor device as defined in claim 23, wherein in the step of providing the support, the support is formed by bonding first bumps formed on the semiconductor chip of the same material as the electrodes and distanced from the electrodes and second bumps formed on the substrate of the same material as the interconnect pattern and distanced from the interconnect pattern.

28. The method of manufacturing a semiconductor device as defined in claim 24, wherein in the step of providing a support, the support is formed by bonding first bumps formed on the semiconductor chip of the same material as the electrodes and distanced from the electrodes and second bumps formed on the substrate of the same material as the interconnect pattern and distanced from the interconnect pattern.

29. The method of manufacturing a semiconductor device as defined in claim 23, wherein the support is formed of an electrically insulating material.

30. The method of manufacturing a semiconductor device as defined in claim 24, wherein the support is formed of an electrically insulating material.

31. The method of manufacturing a semiconductor device as defined in claim 23, wherein the semiconductor chip is subjected to face-down bonding to connect the electrodes with the bonding portions through an anisotropic conductive material formed of conductive particles dispersed within an adhesive.

32. The method of manufacturing a semiconductor device as defined in claim 24, wherein the semiconductor chip is subjected to face-down bonding to connect the electrodes with the bonding portions through an anisotropic conductive material formed of conductive particles dispersed within an adhesive.

33. The method of manufacturing a semiconductor device as defined in claim 23 further comprising a step of forming external electrodes on the lands.

34. The method of manufacturing a semiconductor device as defined in claim 24 further comprising a step of forming external electrodes on the lands.

35. A circuit board on which is mounted the semiconductor device as defined in claim 1.

36. A circuit board on which is mounted the semiconductor device as defined in claim 2.

37. An electronic instrument having the circuit board as defined in claim 35.

38. An electronic instrument having the circuit board as defined in claim 36.

39. The semiconductor device as defined in claim 1, wherein the substrate has through holes formed therein, each of the through holes overlapping with at least a portion of one of the lands.

40. The semiconductor device as defined in claim 2, wherein the substrate has through holes formed therein, each of the through holes overlapping with at least a portion of one of the lands.

41. The semiconductor device as defined in claim 23, wherein the substrate has through holes formed therein, each of the through holes overlapping with at least a portion of one of the lands.

42. The semiconductor device as defined in claim 24, wherein the substrate has through holes formed therein, each of the through holes overlapping with at least a portion of one of the lands.

43. A semiconductor device comprising:

a semiconductor chip which is subjected to face-down bonding, having a plurality of electrodes aligned on a straight line;

a substrate, superposed on the semiconductor chip, on which is formed an interconnect pattern having bonding portions to which the electrodes of the semiconductor chip are connected and lands electrically connected to the bonding portions; and at least one support provided between the semiconductor chip and the substrate, the support not electrically connecting the semiconductor chip to the interconnect pattern.

44. A semiconductor device comprising:

a semiconductor chip which is subjected to face-down bonding, having a plurality of electrodes aligned in the vicinity of a straight line;

a substrate superposed on the semiconductor chip on which is formed an interconnect pattern having bonding portions to which the electrodes of the semiconductor chip are connected and lands electrically connected to the bonding portions; and at least one support provided between the semiconductor chip and the substrate, the support not electrically connecting the semiconductor chip to the interconnect pattern.

* * * * *